US008610517B2

(12) United States Patent
Clark et al.

(10) Patent No.: US 8,610,517 B2
(45) Date of Patent: Dec. 17, 2013

(54) SURFACE ACOUSTIC WAVE RESONATOR MOUNTING WITH LOW ACCELERATION SENSITIVITY (75) Inventors: Roger L. Clark, Windham, NH (US); Seth A. Berman, Marblehead, MA (US); Robert E. Kozlowski, Concord, MA (US); Gary K. Montress, Westford, MA (US)

(73) Assignee: Raytheon Company, Waltham, MA (US)

( * ) Notice: Subject to any disclaimer, the term of this patent is extended or adjusted under 35 U.S.C. 154(b) by 376 days.

(21) Appl. No.: 12/917,738

(22) Filed: Nov. 2, 2010

(65) Prior Publication Data
US 2012/0105175 A1    May 3, 2012

(51) Int. Cl.
H03H 9/05    (2006.01)
H03H 9/205   (2006.01)
H03H 9/25    (2006.01)
H03B 5/32    (2006.01)

(52) U.S. Cl.
USPC ..... 333/193; 333/195; 310/313 B; 331/107 A (58) Field of Classification Search
USPC ....... 333/193–196; 310/313 R, 313 B, 313 C, 310/313 D; 331/107 A
See application file for complete search history.

(56) References Cited

U.S. PATENT DOCUMENTS

| 4,295,102 A * | 10/1981 | Schmidt et al. ............ 331/65 |
| 4,344,010 A | 8/1982 | Vig et al. ..................... 310/361 |
| 4,467,235 A | 8/1984 | De Wames et al. ........ 310/313 D |
| 4,575,690 A | 3/1986 | Walls et al. .................... 331/162 |
| 4,836,882 A | 6/1989 | Ballato ........................... 156/626 |
| 5,337,026 A | 8/1994 | Borchelt et al. .............. 333/150 |
| 5,345,201 A * | 9/1994 | Greer et al. .................... 333/193 |
| 5,416,447 A | 5/1995 | Andres et al. ............. 331/107 A |
| 5,854,578 A | 12/1998 | Minasi et al. ............. 331/117 R |
| 5,933,062 A * | 8/1999 | Kommrusch ................. 333/193 |
| 5,939,784 A | 8/1999 | Glenn .......................... 257/710 |
| 6,025,754 A | 2/2000 | Czora ........................... 330/296 |
| 6,078,229 A * | 6/2000 | Funada et al. ................ 333/193 |
| 6,803,698 B2 * | 10/2004 | Tabota ...................... 310/313 R |
| 6,984,925 B2 | 1/2006 | Morley et al. ................. 310/348 |
| 7,262,665 B1 | 8/2007 | Jin et al. ........................ 330/279 |

(Continued)

FOREIGN PATENT DOCUMENTS

DE    196 34 621 A1    3/1998
EP         1473826 A1    11/2004

(Continued)

OTHER PUBLICATIONS

Machine translation of JP 06-006170 A, published on Jan. 14, 1994, four pages.*

(Continued)

*Primary Examiner* — Barbara Summons
(74) *Attorney, Agent, or Firm* — Daly, Crowley, Mofford & Durkee, LLP (57) ABSTRACT A device, comprising a substrate having opposing first and second surfaces, a first surface acoustic wave resonator disposed on the first surface of the substrate, a second surface acoustic wave resonator disposed on the second surface of the substrate, a first adhesive layer sandwiched between the first surface acoustic wave resonator and the substrate, and a second adhesive layer sandwiched between the second surface acoustic wave resonator.

18 Claims, 8 Drawing Sheets

(56) References Cited

U.S. PATENT DOCUMENTS

| | | | |
|---|---|---|---|
| 7,289,008 B2* | 10/2007 | Kuroki et al. | 333/133 |
| 7,292,104 B1 | 11/2007 | Liwinski | 330/283 |
| 7,348,854 B1 | 3/2008 | Mordkovich | 330/298 |
| 7,397,165 B1 | 7/2008 | Kosinski | 310/313 R |
| 7,432,772 B2 | 10/2008 | Mattisson | 331/158 |
| 7,847,647 B2* | 12/2010 | Martin et al. | 331/107 A |
| 2002/0125792 A1 | 9/2002 | Tabota | 310/313 R |
| 2007/0063617 A1 | 3/2007 | Yamashita | 310/318 |
| 2007/0080757 A1* | 4/2007 | Yahata et al. | 333/133 |
| 2007/0107177 A1* | 5/2007 | Kawachi et al. | 29/25.35 |
| 2007/0108634 A1* | 5/2007 | Higashi et al. | 257/787 |
| 2009/0224851 A1* | 9/2009 | Feiertag et al. | 333/186 |
| 2010/0127786 A1 | 5/2010 | Clark et al. | 331/109 |

FOREIGN PATENT DOCUMENTS

| | | |
|---|---|---|
| JP | 6 006170 A | 1/1994 |
| JP | 9 181562 A | 7/1997 |
| WO | WO 2010/054099 A1 | 5/2010 |

OTHER PUBLICATIONS

K. Koh et al.; "Fabrication of SAW Devices with Small Package Size Using Through Substrate Via Technology"; 2009 IEEE International Ultrasonics Symposium Proceedings, Sep. 20-23, 2009, pp. 2688-2691.*

M. M. Driscoll; "Linear Frequency Tuning of SAW Resonators"; IEEE Transactions on Ultrasonics, Ferroelectrics, and Frequency Control, vol. 38, No. 4, Jul. 1991, pp. 366-369.*

Contents of Related U.S. Appl. No. 12/276,596, filed Nov. 24, 2008, now abandoned.*

Notification of Transmittal of the International Search Report and the Written Opinion of the International Searching Authority, or the Declaration, PCT/US2011/052702, date of mailing Mar. 30, 2012, 13 pages.

Written Opinion of the International Searching Authority, PCT/US2011/052702, date of mailing Mar. 30, 2012, 10 pages.

Invitation to Pay Additional Fees and, Where Applicable, Protest Fee, PCT/US2011/052702, date of mailing Dec. 19, 2011, 8 pages.

Greer, J.A. et al.: "Improved Vibration Sensitivity of the All Quartz Package Surface Acoustic Wave Resonator", Proceedings of the Annual Frequency Control Symposium, Baltimore, Jun. 1-3, 1988; [Proceedings of the Annual Frequency Control Symposium], New York, IEEE, US, vol. SYMP. 42, Jun. 1, 1988, pp. 239-251, XP000093877.

Notification of Transmittal of the International Search Report and the Written Opinion of the International Searching Authority, or the Declaration, PCT/US2009/063666, mailing date Jan. 12, 2010, 4 pages.

Written Opinion of the International Searching Authority, PCT/US2009/063666, mailing date Jan. 12, 2010, 6 pages.

Triquint Semiconductor Product Application Note, Nov. 6, 2011, Robust Bias Option for 0.15μm pHEMPT MMIC Low-Noise Amplifiers, 3 pages.

D.B. Leeson, "A Simple Model of Feedback Oscillator Noise Spectrum", Proceedings of the IEEE, Feb. 1966, pp. 329-330.

Ferre-Pikal et al., "Guidelines for Designing BJT Amplifiers with Low 1/f AM and PM Noise", IEEE Transactions on Ultrasonics, Ferroelectronics, and Frequency Control, vol. 44, No. 2, Mar. 1997, p. 335-343.

Ferre-Pikal, "Reduction of Phase Noise in Linear HBT Amplifiers Using Low-Frequency Active Feedback", IEEE Transactions on Circuits and Systems—I: Regular Papers, vol. 51, No. 8, Aug. 2004, p. 1417-1421.

Drafts, "Acoustic Wave Technology Sensors", Microsensor Systems Inc., Oct. 1, 2000, 14 pages.

International Preliminary Report on Patentability for PCT/2011/052702 dated May 16, 2013.

\* cited by examiner

SURFACE ACOUSTIC WAVE RESONATOR MOUNTING WITH LOW ACCELERATION SENSITIVITY

BACKGROUND

As is known in the art, high frequency RF (radio frequency) signals having good frequency accuracy, spectral purity, and low phase noise are desired in many fields of electronics. To obtain the required frequency stability over temperature and time, these signals can be derived from oscillators, such as bulk acoustic wave (BAW), surface acoustic wave (SAW), microelectronic machined structure (MEMS) acoustic resonators, sapphire resonator oscillators (SRO), and opto-electronic-oscillators employing some form of optical delay.

The degradation of phase noise in vibrating environments is well known and is characterized by a parameter known as acceleration sensitivity. Acceleration sensitivity has tensor properties, but is generally characterized as a vector. Typical values range from $1 \times 10^{-10}$/g to $1 \times 10^{-9}$/g, where 1 g is an acceleration of 9.8 m/s$^2$. Acceleration sensitivity is an issue in conventional oscillators.

As disclosed in R. J. Besson, et al., "Design of a Bulk Quartz Resonator Insensitive to Acceleration," Proceedings of 33$^{rd}$ Annual Symposium on Frequency Control, 1979, when low frequency bulk-acoustic-wave resonators are mounted in a symmetrical structure, low acceleration sensitivity can be obtained. It was later discovered that perfect symmetry results in a resonator insensitive to acceleration, see, e.g., H. F. Tiersten, Y. S. Zhou, "On the normal acceleration sensitivity of contoured resonators stiffened by quartz cover plates supported by clips," J. Appl. Phys. 72 (4) (1992), pp. 1244, 1254, and H. F. Tiersten, "On the Accurate Description of Piezoelectric Resonators Subject to Biasing Deformations," Int. J. Engng Sci., Vol. 33, No. 15, pp. 2239-2259, 1995. Ten MHz bulk-acoustic-resonators having a high degree of symmetry and associated low acceleration sensitivity of $1 \times 10^{-10}$/g are disclosed in U.S. Pat. No. 6,984,925, "Low acceleration sensitivity mounting structures for crystal resonators." However, due to manufacturing and performance limitations, these methods are not applicable to resonators in the UHF or low microwave frequency ranges. Each of the above cited references is incorporated herein by reference.

Surface acoustic wave (SAW) resonators manufactured with semiconductor lithography processes are widely used in the UHF and low microwave frequency range. In J. A. Greer and T. E. Parker, "Improved Vibration Sensitivity of the All Quartz Package Acoustic Wave Resonator," 42$^{nd}$ Annual Symposium on Frequency Control, 1988, it was demonstrated that lower acceleration sensitivity is achieved by fabricating SAW resonators on opposing sides of a quartz substrate. U.S. Pat. No. 5,345,201 to Greer at al., which is incorporated herein by reference, discloses such a symmetrical SAW device. However, this device was never fabricated or utilized outside of a laboratory environment due to difficulties in fabricating the resonators and using them in oscillator assemblies. Some of the difficulties include fabricating resonators on opposing surfaces of the same quartz wafer, obtaining matching electrical performance between the two resonators, and interfacing the opposing bonding pads on the resonator into the oscillator circuit. These difficulties prevented practical implementation of such devices.

SUMMARY

The present invention provides methods and apparatus for resonators with low acceleration sensitivity and fundamental resonance frequencies in the UHF and lower microwave frequency range, for example. Exemplary embodiments of inventive resonator devices are producible with known manufacturing techniques, such as photolithography. In one particular embodiment, resonators are integrated into oscillator assemblies with a bonding surface on the top surface only. In one embodiment, a tuning mechanism enables 'tuning' of resonator acceleration sensitivity post assembly in the oscillator.

In one aspect of the invention, a device comprises: a substrate having opposing first and second surfaces, a first surface acoustic wave resonator disposed on the first surface of the substrate, a second surface acoustic wave resonator disposed on the second surface of the substrate, a first adhesive layer sandwiched between the first surface acoustic wave resonator and the substrate, and a second adhesive layer sandwiched between the second surface acoustic wave resonator, wherein the first adhesive layer includes a first cutout region and the second adhesive layer includes a second cutout region.

The device can further include one or more of the following features: the first surface acoustic wave resonator includes an active surface and the second surface acoustic wave resonator includes an active surface facing an opposite direction as the active surface of the first surface acoustic wave resonator, acceleration forces in a first direction cause deflection of the active surface of the first surface acoustic wave resonator to tension and deflection of the active surface of the second surface acoustic wave resonator to compression so that a summation of the mechanical strain on the first and second surface acoustic wave resonators is about zero to provide an acceleration insensitive device, the first and second surface acoustic wave resonators are connected in parallel such that respective shifts in frequency for the first and second acoustic wave resonators substantially cancel each other, the first and second surface acoustic wave resonators are symmetrical, a compliant adhesive about the substrate, the first cutout region is rectangular, the first cutout region has an aspect ratio approximating an acoustic length-to-width ratio of the first surface acoustic wave resonator, the first surface acoustic wave resonator operates at frequency ranging from about 200 MHz to about 3 GHz, the device forms a part of a low noise oscillator, wirebonds provide electrical connections from the device, bonding pads on only one surface of the device, and wirebonds coupled to the bonding pads connect the first surface acoustic wave resonator to the second surface acoustic wave resonator in parallel.

In another aspect of the invention, a device comprises: substrate having opposing first and second surfaces, a first surface acoustic wave resonator disposed on the first surface of the substrate, a second surface acoustic wave resonator disposed on the second surface of the substrate and electrically coupled to the first surface wave resonator, a first adhesive layer sandwiched between the first surface acoustic wave resonator and the substrate, a second adhesive layer sandwiched between the second surface acoustic wave resonator, and a tuning mechanism coupled to the first surface acoustic wave resonator to tune the first surface acoustic wave resonator with respect to the second surface acoustic wave resonator.

The device can further include one or more of the following features: the first surface acoustic wave resonator includes an active surface and the second surface acoustic wave resonator includes an active surface facing an opposite direction as the active surface of the first surface acoustic wave resonator, acceleration forces in a first direction cause deflection of the active surface of the first surface acoustic wave resonator to tension and deflection of the active surface of the second surface acoustic wave resonator to compression so that a summation of the mechanical strain on the first and second surface acoustic wave resonators is about zero to provide an acceleration insensitive device, the first and second surface acoustic wave resonators are connected in parallel such that respective shifts in frequency for the first and second acoustic wave resonators substantially cancel each other, the first surface acoustic wave resonator operates at frequency ranging from about 200 MHz to about 3 GHz, wirebonds provide electrical connections from the device, and bonding pads on only one surface of the device, wherein the wirebonds are coupled to the bonding pads for connecting the first surface acoustic wave resonator to the second surface acoustic wave resonator in parallel.

BRIEF DESCRIPTION OF THE DRAWINGS

The foregoing features of this invention, as well as the invention itself, may be more fully understood from the following description of the drawings in which.

DETAILED DESCRIPTION

The present invention relates to RF signal generation, and more specifically, to low noise signal generation in the presence of mechanical vibration. In general, exemplary embodiments of the present invention include first and second resonators mounted on opposing surfaces of a carrier substrate. An adhesive, such as such as epoxy or silicone, bonds the resonators to the surface of the carrier substrate, which has electrical via connections between the first and second resonators for coupling the first and second resonators in a desired way, such as in parallel or in series. As is known to one of ordinary skill in the art, connecting the first and second resonators in parallel increases power handling, while connecting the resonators in series increases the effective phase slope. Under acceleration forces, the active surface of the first resonator is in compression and the active surface of the second resonator is in tension. Summation of the mechanical strain of the first and second resonators results in a total net strain of about zero. With this arrangement, the effects of external acceleration on frequency are cancelled, resulting in a dual resonator device insensitive to acceleration. Since the device is symmetrical in three axes, the benefits of symmetry extend to the three axes.

Figure 1:
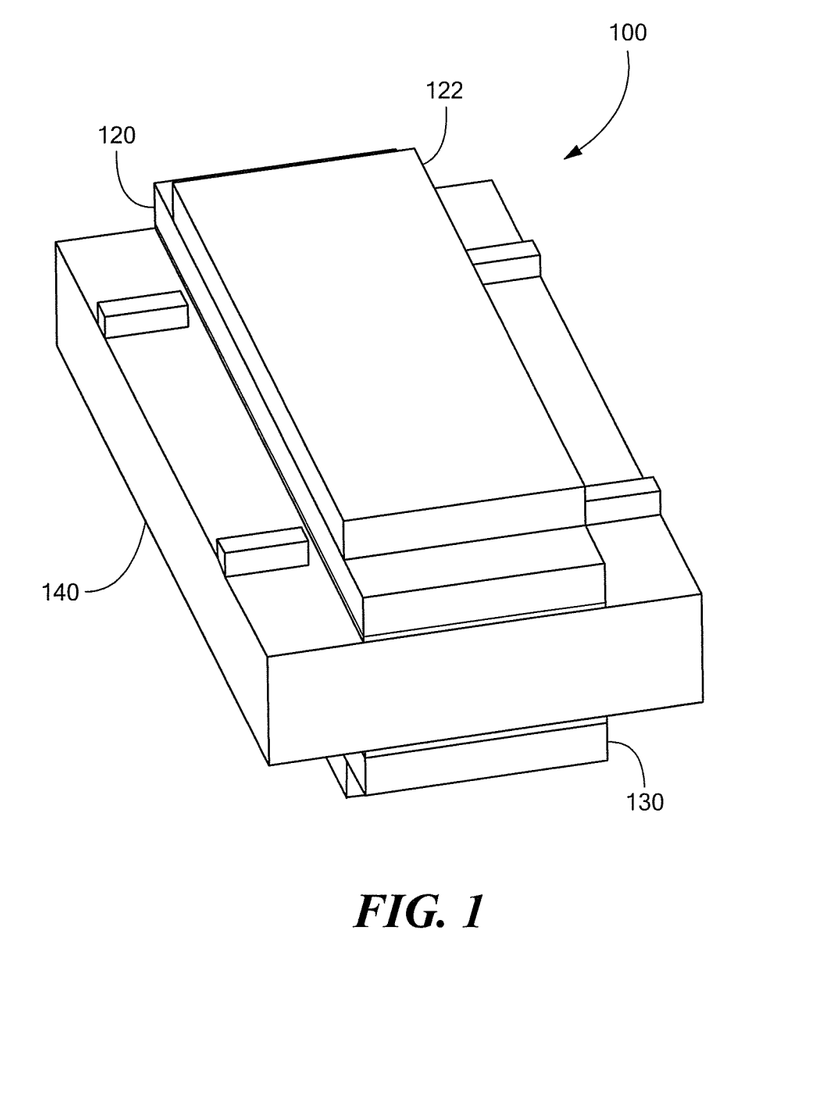
FIG. 1 is an isometric view of a symmetrical SAW resonator device in accordance with exemplary embodiments of the invention.
Figure 2:
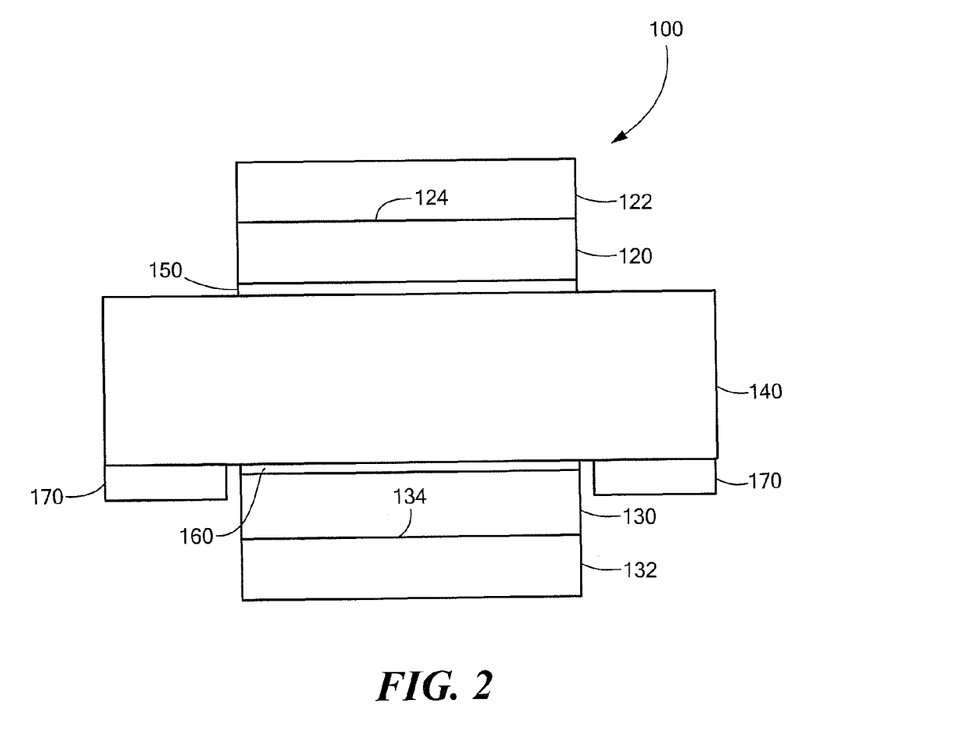
FIG. 2 is a cross-sectional side view of the symmetrical SAW resonator device of FIG. 1.
Figure 3:
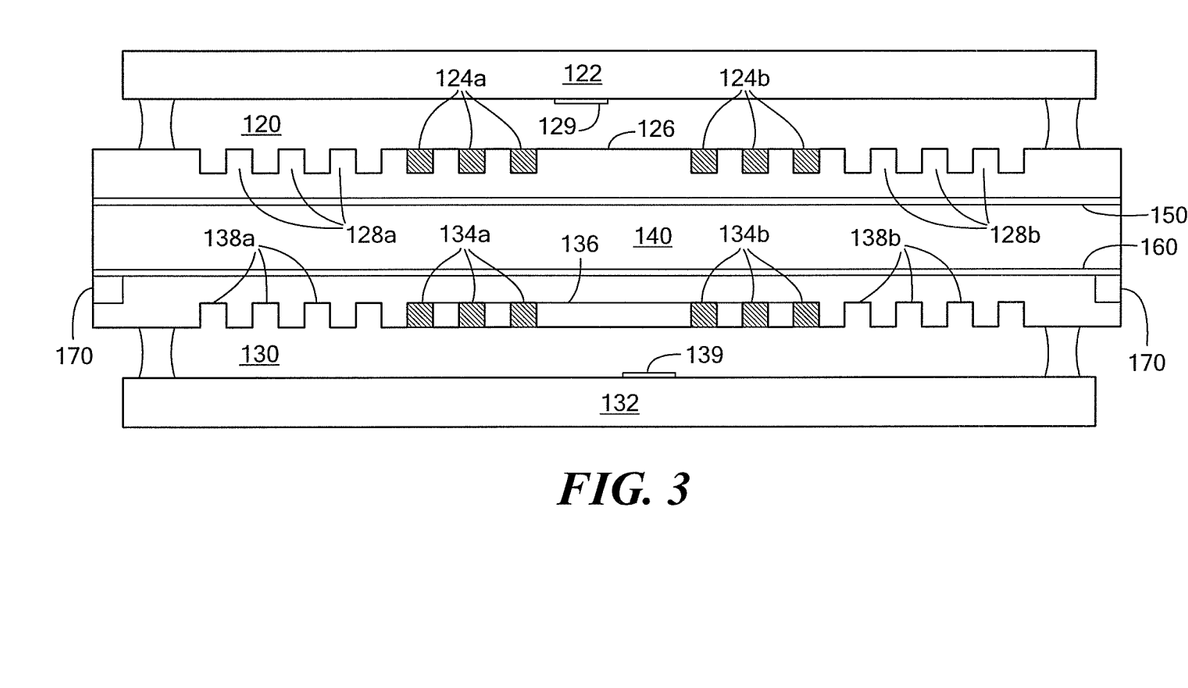
FIG. 3 is a cross-sectional side view showing further detail of the symmetrical SAW resonator device of FIG. 1.
Figure 4:
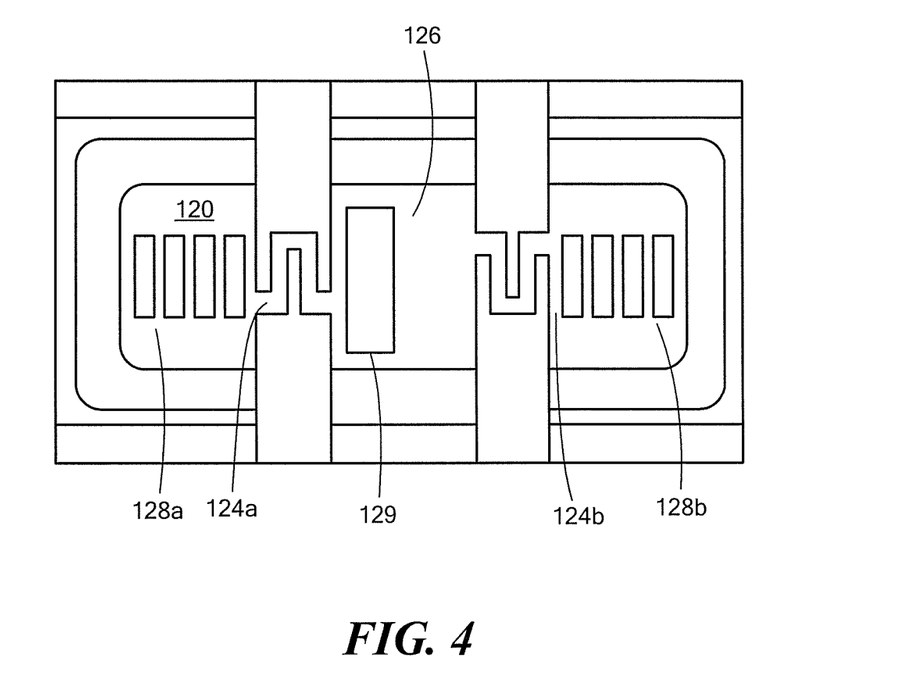
FIG. 4 is a schematic top view of the symmetrical SAW resonator device of FIG. 1.

FIGS. 1-4 show an exemplary surface acoustic wave (SAW) resonator device 100 in accordance with exemplary embodiments of the invention. FIGS. 3 and 4 show further detail for the dual resonator device of FIGS. 1 and 2. The device 100 includes a first resonator 120 and a second resonator 130 disposed on opposite sides of a carrier substrate 140. The carrier substrate 140 is fabricated from a suitably rigid material, such as aluminum oxide. The first resonator 120 includes a first plate 122 covering an active surface 124 of the first resonator. Similarly, the second resonator 130 includes a second plate 132 covering an active surface 134 of the second resonator. In an exemplary embodiment, the plates 122, 132 and the resonators 120, 130 form an all-quartz-package SAW resonator.

A first adhesive layer 150 is disposed between the substrate 140 and the first resonator 120 and a second adhesive layer 160 is disposed between the second resonator 130 and the substrate 140. The adhesive layers 150, 160 can be provided from a variety of suitable materials, such as epoxy or silicone adhesive.

A compliant adhesive 170 secures the symmetrical SAW device 100 to higher levels of assembly. One exemplary adhesive is Part No. 3140 from Dow Corning Company of Midland, Mich. The compliant adhesive 170 mechanically isolates the symmetrical SAW device from the higher assembly.

Referring now to FIGS. 3 and 4, each of the first and second resonators 120, 130 includes a respective pair of interdigitated transducers 124a, 124b, and 134a, 134b disposed on respective surface wave propagation surfaces 126, 136. Each resonator also includes a pair of reflecting gratings 128a, 128b and 138a, 138b to confine surface wave propagation substantially between the pairs of transducers. The resonators 120, 130 can include a respective trim pad 129, 139 disposed on an inner surface thereof. In general, the features of the resonators 120, 130 should be disposed in substantial mutual alignment so that any vibration-induced strain on one SAW resonator will produce an equal but opposite strain in the other resonator.

Since the most significant contribution of vibration-induced frequency variations is from forces applied normal to the surface wave propagation surfaces, the composite SAW device 100 has a frequency characteristic which is substantially invariant with applied stress. Stress applied perpendicular to the substrate 140 subjects one of the resonator surfaces 126, 136 of the substrate to a tensile strain field and the other surface to a compression strain field. These strain fields induce equal, but opposite, shifts in the frequency characteristic of the respective individual SAW resonators 120, 130. These shifts are substantially equal in magnitude and are substantially 180 degrees out of phase, thus cancelling each other if the first and second resonators are connected in parallel.

As is well known in the art, surface acoustic wave (SAW) devices and sensors generally use a piezoelectric material to generate acoustic waves. Piezoelectricity refers to the production of electrical charges in response to mechanical stress, and vice-versa. Surface acoustic wave (SAW) devices generate surface waves that travel along a substrate. An input interdigitated transducer (IDT) generates a surface acoustic wave that propagates along the substrate for conversion back to an electric field at an output IDT. The waves have a longitudinal and a vertical shear component that can couple with a medium in contact with the device surface. The surface waves have virtually all their acoustic energy confined within one wavelength of the surface. SAW resonator devices are sensitive to perturbations, such as deformation due to acceleration forces, particles, etc, and thus, are generally hermetically sealed to prevent undesired changes in output.

Figure 5:
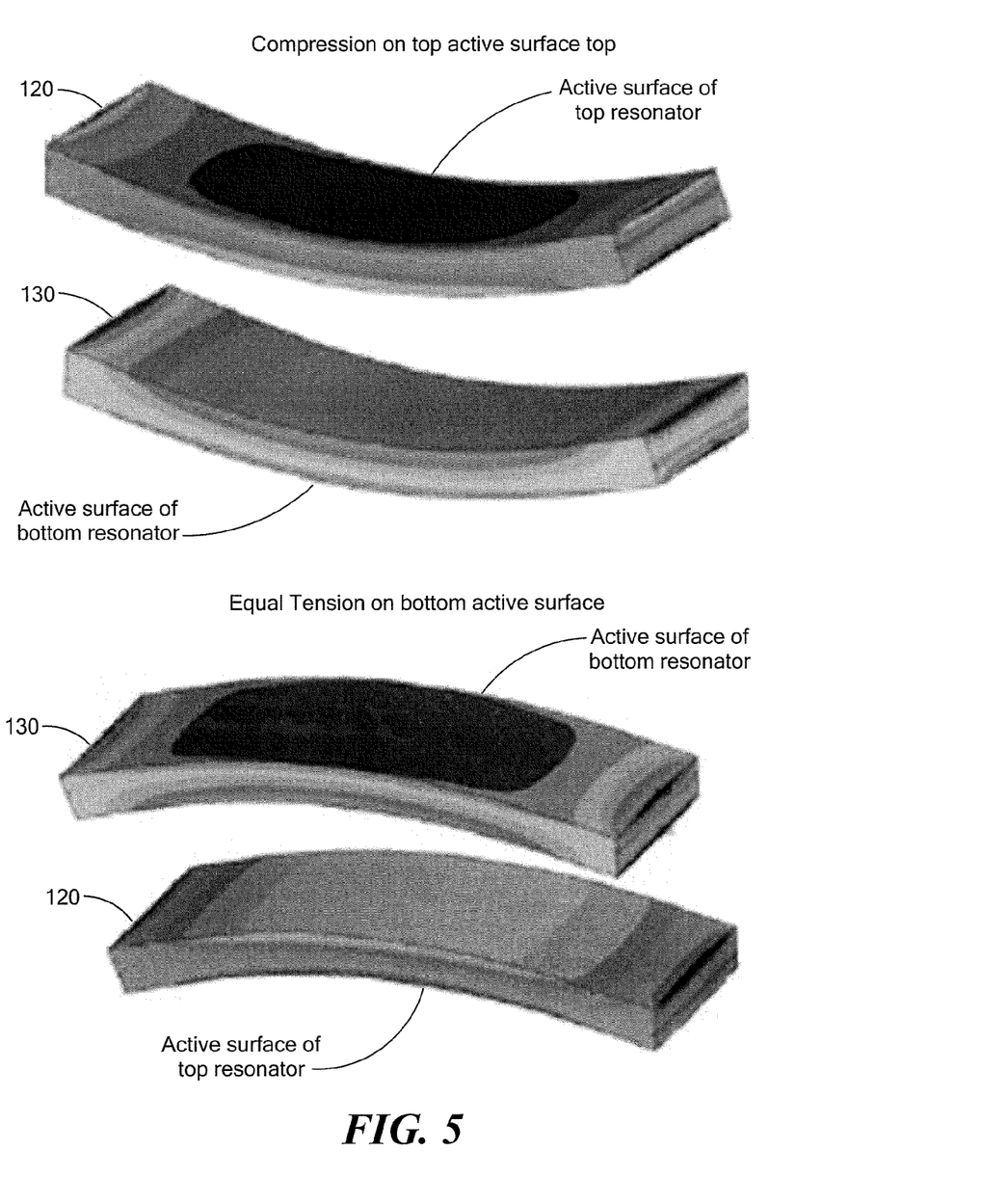
FIG. 5 is pictorial representation of strain on the top and bottom active surfaces of an exemplary resonator, where the bottom active surface has been rotated by 180 degrees to illustrate the equal magnitude and opposite in sign strain.
Figure 6:
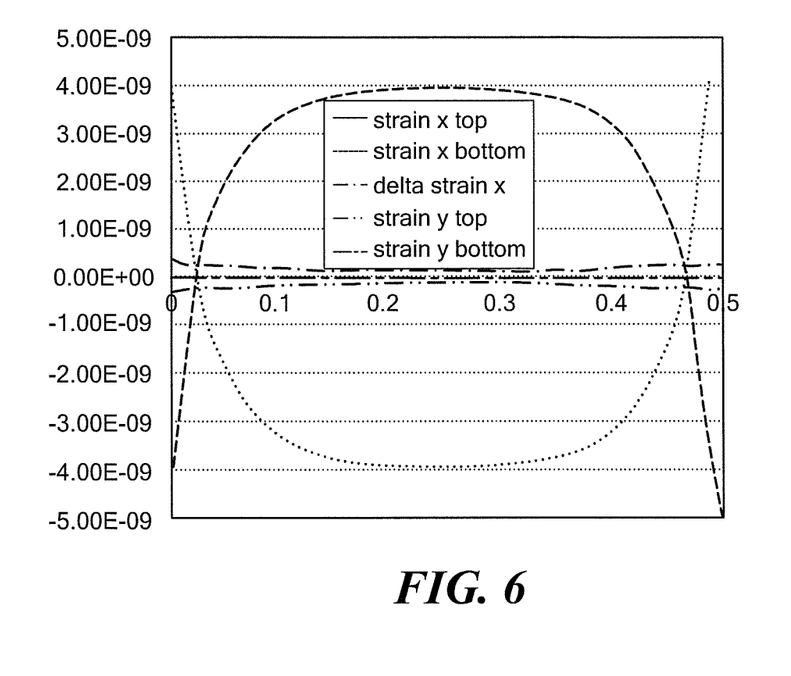
FIG. 6 is a graphical representation of the longitudinal and transverse strain on the active surface along the centerline of a longitudinal axis of an exemplary resonator in accordance with exemplary embodiments of the invention, where delta strain X is the combined strain on the upper and lower surfaces and is essentially zero.

FIG. 5, which is an exploded view of the first and second resonators of FIGS. 1-4, shows deflection of the first (top) resonator 120 and the second (bottom) resonator 130 in response to acceleration forces. As can be seen, the active surface of the top resonator 120 is in compression while the active surface of the bottom resonator 130 is in tension. As shown in FIG. 6, the compression and tension in the respective resonators result in a net strain of about zero to provide a device that is relatively insensitive to acceleration.

Figure 7:
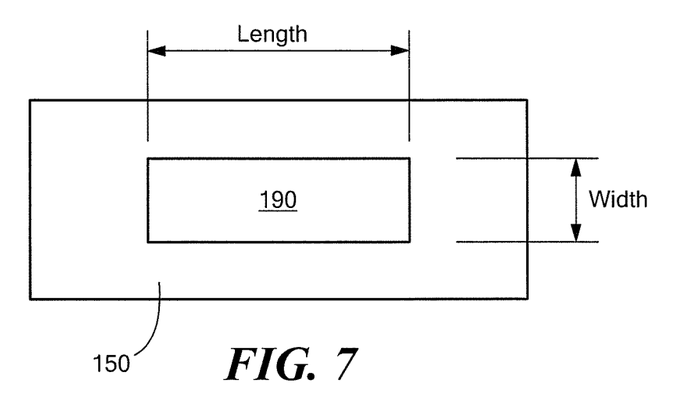
FIG. 7 is a schematic representation of an adhesive layer having a cutout region that can form a part of a resonator in accordance with exemplary embodiments of the invention.

In an exemplary embodiment shown in FIG. 7, the first and/or second adhesive layer 150, 160 is a two-sided tape having a portion removed to define a cutout region 190. An exemplary adhesive tape is supplied by St. Gobain Performance Plastics, based in Paris, France, as part number CHR 2905-7R. It is understood that only the first adhesive layer 150 is shown to simplify describing an embodiment of the invention. By selecting dimensions of the cutout region 190, the stress field in the resonator device can be modified in a desired manner. It is understood that the dimensions and geometry of the cutout region 190 can vary to meet the needs of a particular application. For example, the cutout region 190 can be rectangular with a specific aspect ratio of length-to-width for a particular SAW resonator design. In one particular embodiment, the cutout region 190 having an aspect ratio similar to the acoustic length-to-width ratio was found to be optimal.

In general, the adhesive layer 150,160 should not exhibit characteristics of creep or hardening over time since changes in the properties of this tape over time may lead to drifts in the frequency of the SAW resonators. The adhesive layer 150, 160 should be of uniform thickness and exhibit a controlled amount of compliance. For example, a tape that has varying thickness will disturb the strain in the SAW resonator and reduce the desired symmetry.

With the cutout region 190, the active area of the resonator is supported only by quartz substrate and not by the adhesive layer 150. That is, only a border region around a periphery of the resonator is supported by the adhesive layer 150. Since the adhesive layer 150 introduces significantly more stress irregularity than quartz, mechanical stress becomes significantly more uniform with adhesive removed in the cutout region, which provides greater uniformity of the acceleration sensitivity and improves matching between the opposing resonators.

In an exemplary embodiment, the cutout region 190 is empty allowing the quartz material to flex very slightly, which produces a strain in one device, and compression in the other.

It is understood that the geometry of the cutout region can vary to meet the needs of a particular application. In alternative embodiments, the cutout region has a shape other than rectangular, such as ovular, circular, and the like.

In another aspect of the invention, a device includes opposing first and second resonators with a tuning mechanism to change the phase and/or attenuation of an individual resonator to adjust a total composite acceleration response for the device. The tuning mechanism enables fine-tuning of the device to minimize differences in operating characteristics between the first and second resonators.

Figure 8:
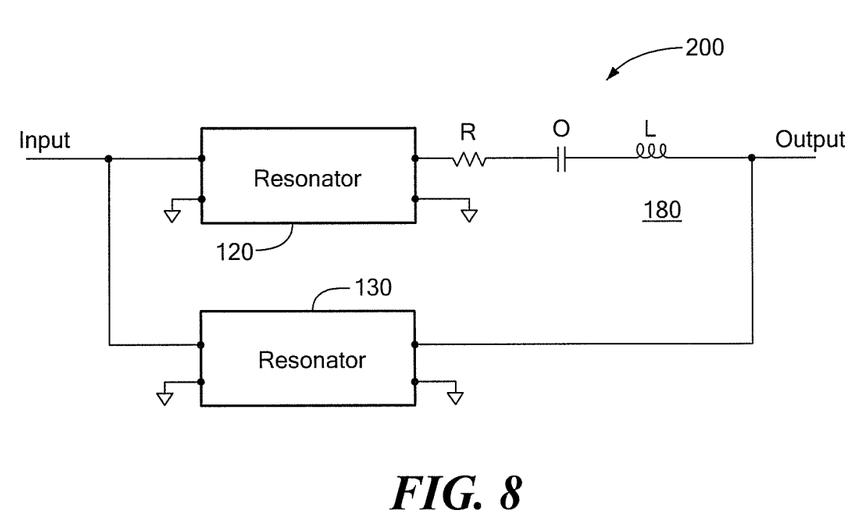
FIG. 8 is a schematic representation of a tuning mechanism having RLC components for tuning a first resonator with respect to a second resonator in an exemplary symmetrical SAW in accordance with exemplary embodiments of the invention.

FIG. 8 shows a device 200 having first and second resonators 120, 130 with a tuning mechanism 180 in the form of a series RLC (resistor-inductor-capacitor) circuit coupled between the resonators and the oscillator circuitry. The RLC components change both the phase and signal strength of the current flowing through the first resonator 120 relative to the second resonator 130. If the first resonator 120 has higher acceleration sensitivity than the second resonator 130, the current can be reduced by increasing the resistance of the resistor R for adjusting the total acceleration sensitivity. If the series reactance of inductor L and capacitor C of the RLC circuit are chosen to be equal in magnitude, then the combined reactance will sum to zero and will not alter the frequency of the composite resonator. However, if the first resonator 120 has a different frequency than the second resonator 130, then the capacitor C and resistor R can be used to align the frequencies of the first and second resonators. The sum of the reactance of inductor L and capacitor C can be positive or negative. If the summed reactance is positive, then the frequency of the first resonator 120 can be lowered. Similarly, if the summed reactance is negative, then the frequency of first resonator 120 can be raised. It is understood that an RLC circuit can be coupled to each resonator, such as for ease of manufacture and/or tuning.

With this arrangement, the frequency of the resonators can be precisely matched. These effects have been found to cause variations in the acceleration sensitivity and can be used to align resonators for optimal suppression of the acceleration sensitivity.

Figure 9:
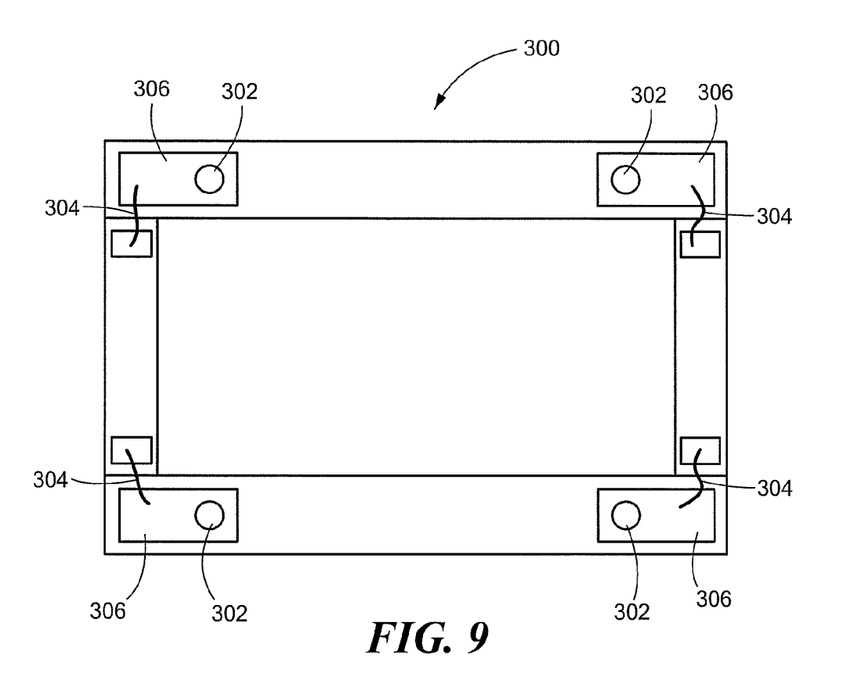
FIG. 9 is a schematic representation of an exemplary SAW resonator having bond pads and vias in accordance with exemplary embodiments of the invention.

FIG. 9 shows the placement of bonding pads for a composite resonator device 300 in accordance with exemplary embodiments of the invention. With the bonding pads located on the upper surface, the device can be readily integrated with oscillator circuitry using well-known wirebonding techniques.

In the illustrated embodiment, vias 302 are located in corners of the device 300 to provide connections to the various layers of the device. For example, the vias 302 enable the connection of the first and second resonators 120, 130 in parallel. Internal wirebonds 304 provide connections between the carrier substrate 140 and the resonators 120, 130. External I/O bond pads 306 provide connects to device to a higher assembly or other device. By placing the bonding pads on a top surface of the device, wirebonds can be used to easily integrate the device with oscillator or other circuitry.

Exemplary piezoelectric substrate materials for SAW devices in accordance with exemplary embodiments of the present invention include quartz ($SiO_2$), lithium tantalate ($LiTaO_3$), lithium niobate ($LiNbO_3$), gallium arsenide (GaAs), silicon carbide (SiC), langasite (LGS), zinc oxide (ZnO), aluminum nitride (AlN), lead zirconium titanate (PZT), and polyvinylidene fluoride (PVdF).

It is understood that a variety of suitable fabrication techniques known to one of ordinary skill in the art can be used to provide exemplary embodiments of the invention. Exemplary processes includes photolithography. Details of an exemplary fabrication process for a SAW all-quartz resonator device are set forth in the '201 patent to Greer.

It is understood that a variety of alternative embodiments are contemplated that are well within the scope of the invention. For example, additional resonators can form a part of an acceleration insensitive SAW device. In one embodiment, four resonators are affixed to opposing faces of a stiff box to produce symmetry in two axes. In another embodiment, six resonators are affixed to a ceramic cube, so that there is symmetry in three mutually perpendicular axes. It is further understood that tuning mechanisms can include elements other than RLC components.

It is understood that exemplary devices can include various dimensions for the components to meet the needs of a particular application. In one embodiment, the resonator is about 0.655×0.200×0.035 inches, the cover is about 0.535×0.200×0.035 inches, the frit between the crystal and the cover is about 1-2 mils thick, the adhesive layer is about 7 mils in thickness, the silicone adhesive has a thickness of about 0.020 inches, and the ceramic is about 0.655×0.360×0.060 inches.

In exemplary embodiments, the frequency ranges from about 200 MHz to about 3 GHz, where device feature is inversely proportional to frequency. The lower frequency limit is defined by how physically large a device can be. A device limit may be approximately one inch in length. The upper frequency limit is defined by the smallest feature size that can be fabricated with lithography methods. The upper frequency feature size is about 0.2 micron.

Figure 10:
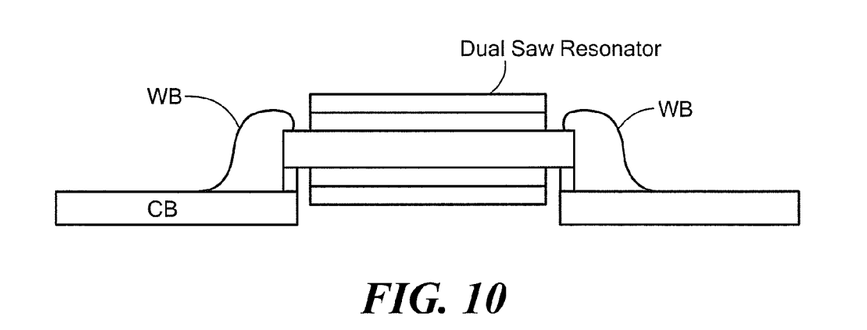
FIG. 10 is a schematic representation of an exemplary SAW resonator coupled to a circuit board in accordance with exemplary embodiments of the invention.

FIG. 10 shows an exemplary dual SAW resonator device embedded into an electronic assembly in accordance with an embodiment of the invention. Wirebonds WB are used to connect the device to a circuit board CB. Alternatively, ribbon bonds can be used. The circuit board can be ceramic, fiberglass type of material known as FR-4, or other suitable material. Other electronic components used to construct the oscillator are attached using solder or other well-known methods. Note that only the bonds used to attach the device to the circuit board are shown. The wirebonds WB connect the two SAW resonators in the device.

In one embodiment, a multi-resonator device is embedded into a low noise SAW oscillator. The SAW resonator is a primary determining factor in establishing the frequency stability and phase noise of the SAW oscillator. An exemplary low noise oscillator in which exemplary embodiments of the invention can be incorporated is shown and described in U.S. Patent Publication No. 2010/0127786, to Clark, Cooper and Gugliuzza, which is incorporated herein by reference.

Having described exemplary embodiments of the invention, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

What is claimed is:

1. A device, comprising:
a substrate having opposing first and second surfaces;
a first surface acoustic wave resonator disposed on the first surface of the substrate;
a second surface acoustic wave resonator disposed on the second surface of the substrate, wherein the first and second surface acoustic wave resonators are symmetrical;
a first adhesive layer sandwiched between the first surface acoustic wave resonator and the substrate; and
a second adhesive layer sandwiched between the second surface acoustic wave resonator and the substrate;
wherein the first adhesive layer includes a first cutout region and the second adhesive layer includes a second cutout region.

2. The device according to claim 1, wherein the first surface acoustic wave resonator includes an active surface and the second surface acoustic wave resonator includes an active surface facing an opposite direction as the active surface of the first surface acoustic wave resonator.

3. The device according to claim 1, wherein the first and second surface acoustic wave resonators are connected in parallel such that respective shifts in frequency for the first and second acoustic wave resonators substantially cancel each other.

4. The device according to claim 1, further including a compliant adhesive disposed on at least a portion of the substrate.

5. The device according to claim 1, wherein the first cutout region is rectangular.

6. The device according to claim 1, wherein the first cutout region has an aspect ratio approximating an acoustic length-to-width ratio of the first surface acoustic wave resonator.

7. The device according to claim 1, wherein the first surface acoustic wave resonator operates at frequency ranging from about 200 MHz to about 3 GHz.

8. The device according to claim 1, further including bonding pads on only one surface of the device.

9. The device according to claim 8, wherein wirebonds coupled to the bonding pads connect the first surface acoustic wave resonator to the second surface acoustic wave resonator in parallel.

10. A device, comprising:
a substrate having opposing first and second surfaces;
a first surface acoustic wave resonator disposed on the first surface of the substrate;
a second surface acoustic wave resonator disposed on the second surface of the substrate;
a first adhesive layer sandwiched between the first surface acoustic wave resonator and the substrate; and
a second adhesive layer sandwiched between the second surface acoustic wave resonator and the substrate;
wherein the first adhesive layer includes a first cutout region and the second adhesive layer includes a second cutout region, and
wherein the device forms a part of a low noise oscillator.

11. The device according to claim 10, wherein wirebonds provide electrical connections from the device.

12. A device, comprising:
a substrate having opposing first and second surfaces;
a first surface acoustic wave resonator disposed on the first surface of the substrate;
a second surface acoustic wave resonator disposed on the second surface of the substrate;
a first adhesive laser sandwiched between the first surface acoustic wave resonator and the substrate; and
a second adhesive layer sandwiched between the second surface acoustic wave resonator and the substrate;
wherein the first adhesive layer includes a first cutout region and the second adhesive layer includes a second cutout region,
wherein the first surface acoustic wave resonator includes an active surface and the second surface acoustic wave resonator includes an active surface facing an opposite direction as the active surface of the first surface acoustic wave resonator, and
wherein acceleration forces in a first direction cause deflection of the active surface of the first surface acoustic wave resonator to tension and deflection of the active surface of the second surface acoustic wave resonator to compression so that a summation of the mechanical strain on the first and second surface acoustic wave resonators is about zero to provide an acceleration insensitive device.

13. A device, comprising:
a substrate having opposing first and second surfaces;
a first surface acoustic wave resonator disposed on the first surface of the substrate;
a second surface acoustic wave resonator disposed on the second surface of the substrate and electrically coupled to the first surface acoustic wave resonator;
a first adhesive layer sandwiched between the first surface acoustic wave resonator and the substrate;
a second adhesive layer sandwiched between the second surface acoustic wave resonator and the substrate; and
a tuning mechanism coupled to the first surface acoustic wave resonator to tune the first surface acoustic wave resonator with respect to the second surface acoustic wave resonator,
wherein acceleration forces in a first direction cause deflection of an active surface of the first surface acoustic wave resonator to tension and deflection of an active surface of the second surface acoustic wave resonator to compression so that a summation of the mechanical strain on the first and second surface acoustic wave resonators is about zero to provide an acceleration insensitive device.

14. The device according to claim 13, wherein the tuning mechanism includes an RLC circuit.

15. The device according to claim 13, wherein the active surface of the second surface acoustic wave resonator faces an opposite direction as the active surface of the first surface wave acoustic wave resonator.

16. The device according to claim 13, wherein the first and second surface acoustic wave resonators are connected in parallel such that respective shifts in frequency for the first and second acoustic wave resonators substantially cancel each other.

17. The device according to claim 13, wherein the first surface acoustic wave resonator operates at frequency ranging from about 200 MHz to about 3 GHz.

18. The device according to claim 13, further including bonding pads on only one surface of the device, wherein wirebonds are coupled to the bonding pads for connecting the first surface acoustic wave resonator to the second surface acoustic wave resonator in parallel.

* * * * *